(12) United States Patent
Wunnicke et al.

(10) Patent No.: US 8,962,453 B2
(45) Date of Patent: Feb. 24, 2015

(54) SINGLE CRYSTAL GROWTH ON A MIS-MATCHED SUBSTRATE

(75) Inventors: Olaf Wunnicke, Eindhoven (NL); Lars Magnus Tarlé Borgstrom, Lund (CH); Vijayaraghavan Madakasira, Bangalore (IN)

(73) Assignee: NXP B.V., Eindhoven (NL)

( * ) Notice: Subject to any disclaimer, the term of this patent is extended or adjusted under 35 U.S.C. 154(b) by 589 days.

(21) Appl. No.: 12/668,050

(22) PCT Filed: Jul. 7, 2008

(86) PCT No.: PCT/IB2008/052727
§ 371 (c)(1),
(2), (4) Date: Jun. 23, 2010

(87) PCT Pub. No.: WO2009/007907
PCT Pub. Date: Jan. 15, 2009

(65) Prior Publication Data
US 2010/0261339 A1    Oct. 14, 2010

(30) Foreign Application Priority Data

Jul. 10, 2007  (EP) ..................................... 07112157

(51) Int. Cl.
*C30B 29/60* (2006.01)
*C30B 11/12* (2006.01)
*H01L 21/02* (2006.01)

(52) U.S. Cl.
CPC .................. *C30B 29/60* (2013.01); *C30B 11/12* (2013.01); *H01L 21/02381* (2013.01); *H01L 21/02538* (2013.01); *H01L 21/02551* (2013.01); *H01L 21/02565* (2013.01); *H01L 21/02603* (2013.01);

(Continued)

(58) Field of Classification Search
USPC .............................. 438/478, 689; 257/E21.09
See application file for complete search history.

(56) References Cited

U.S. PATENT DOCUMENTS

2004/0079278 A1    4/2004  Kamins et al.
2005/0022725 A1    2/2005  Jurgensen et al.

(Continued)

FOREIGN PATENT DOCUMENTS

WO    2004038767 A2    5/2004

OTHER PUBLICATIONS

Seifert, W., et al; "Growth of One-Dimensional Nanostructures in MOVPE"; Journal of Crystal Growth; vol. 272, No. 1-4; Dec. 10, 2004; pp. 211-220.

Fang, X., et al; "Reduction of Threading Dislocations in GaN Layers Using In Situ Deposited Silicon Nitrade Masks on AlN and GaN Nucleation Layers"; Applied Physics Letters; vol. 84, No. 4; Jan. 26, 2004; pp. 484-486.

(Continued)

*Primary Examiner* — Tony Tran

(57) ABSTRACT

A process for forming a single crystal layer of one material type such as III-V semiconductor) onto a substrate of a different material type such as silicon. A substrate of a first material type is provided. At least one discrete region of catalyst material is deposited onto the substrate, the discrete region defining a seed area of the substrate. A second material type such as III-V semiconductor is grown as a single crystal nanowire onto the substrate between the substrate and catalyst material, the nanowire of second material type extending upward from the substrate with lateral dimensions not substantially exceeding the seed area. After growth of the nanowire, growth conditions are changed so as to epitaxially grow the second material type laterally from the single crystal nanowire in a direction parallel to the substrate surface.

21 Claims, 2 Drawing Sheets

Figure 2C:
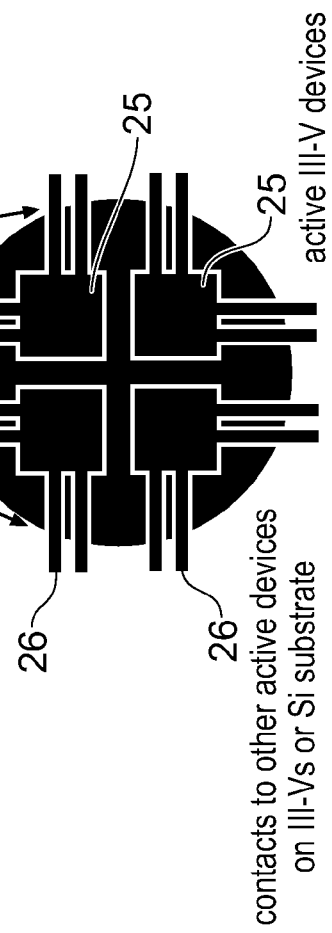

(52) U.S. Cl.
CPC .... *H01L 21/02639* (2013.01); *H01L 21/02645* (2013.01); *H01L 21/02647* (2013.01); *H01L 21/02653* (2013.01)
USPC .......................................... 438/478; 438/689

(56) References Cited

U.S. PATENT DOCUMENTS

| | | |
|---|---|---|
| 2005/0161662 A1 | 7/2005 | Majumdar et al. |
| 2005/0199883 A1 | 9/2005 | Borghs et al. |
| 2005/0199886 A1 | 9/2005 | Yi et al. |
| 2005/0245095 A1 | 11/2005 | Haskell et al. |
| 2005/0248003 A1 | 11/2005 | Tsybeskov et al. |
| 2006/0223211 A1 | 10/2006 | Mishra et al. |
| 2008/0149944 A1* | 6/2008 | Samuelson et al. ............ 257/88 |
| 2008/0171430 A1* | 7/2008 | Kamins ........................ 438/618 |
| 2008/0272299 A1* | 11/2008 | Jin et al. ....................... 250/310 |
| 2008/0315430 A1* | 12/2008 | Weber et al. .................. 257/774 |

OTHER PUBLICATIONS

Dailey, J., et al; "Vapor-Liquid-Solid Growth of Germanium Nanostructures on Silicon"; Journal of Applied Physics, American Institute of Physics; New York, NY, US; vol. 96, No. 12; Jan. 1, 2004; pp. 7556-7557.

Traci, J., et al; "Nanopillar Growth Mode by Vapor-Liquid-Solid Epitaxy"; Applied Physics Letters, AIP, American Institute of Physics, Melville, NY, US; vol. 84, No. 26, Jun. 17, 2004; pp. 5302-5304.

Kusakabe, K., et al; "Characterization of Overgrown GaN Layers on Nano-Columns Grown by RF-Moleular Beam Epitaxy"; Japanese Journal of Applied Physics, Japan Society of Applied Physics; Tokyo, JP; vol. 40, No. 3A, Part 02; Mar. 1, 2001; pp. L192-L194.

Calleja, E., et al; "Growth, Morphology, and Structural Properties of Group-III-Nitride Nanocolumns and Nanodisks"; Phys. Stat. Sol. (b) 244, No. 8 2007; pp. 2816-2837.

* cited by examiner

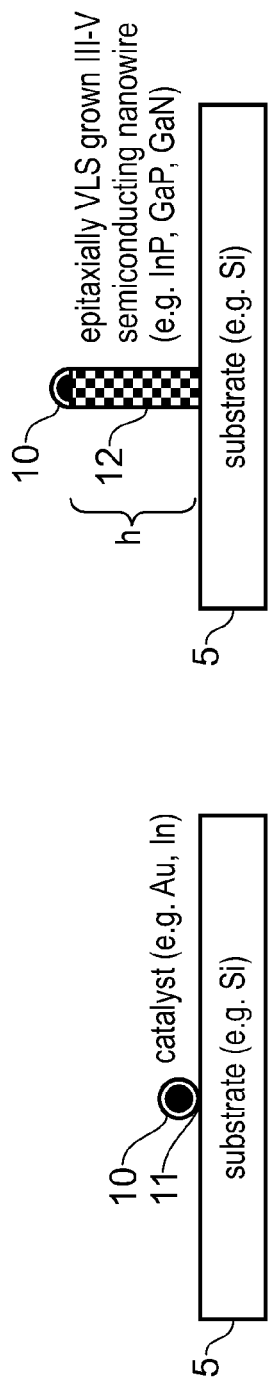
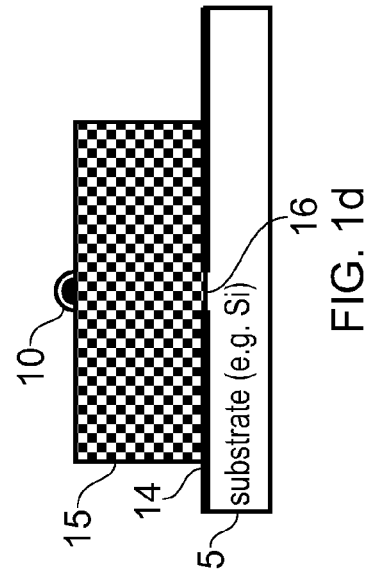
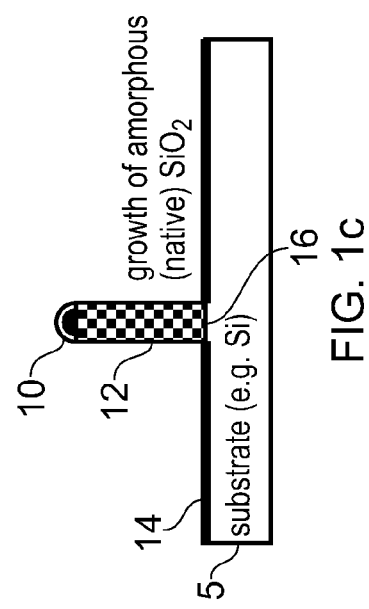
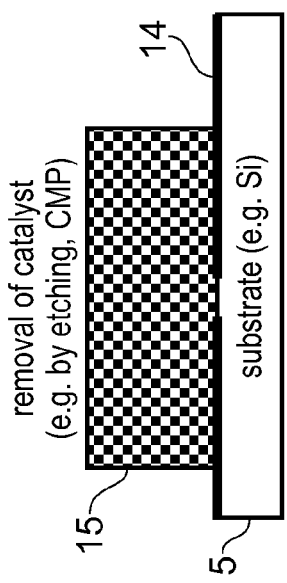
FIG. 1a  FIG. 1b  FIG. 1c  FIG. 1d  FIG. 1e

SINGLE CRYSTAL GROWTH ON A MIS-MATCHED SUBSTRATE

The present invention relates to epitaxial growth of single crystal material on a substrate of dissimilar material. In particular, though not exclusively, the invention relates to the growth of III-V or II-VI single crystal semiconductors on a group IV substrate such as silicon.

It is desirable to be able to integrate III-V semiconductor materials onto silicon substrates. III-V semiconductors may have superior electronic properties compared with silicon, e.g. better charge mobility and different band gaps. Disadvantages of III-V semiconductors are that they are relatively difficult to grow and relatively more expensive. Integration of III-V semiconductors onto group IV substrates therefore offers advantages such as use of significantly cheaper substrates, the ability to use highly developed silicon processing technology and the ability to integrate III-V and silicon-based devices on the same substrate.

When III-V semiconductors are grown on silicon substrates, the resulting III-V layer generally contains an unacceptable density of lattice defects, owing to the large mismatch in lattice constants. Furthermore, the thermal expansion coefficients are generally very different making it difficult to grow III-V layers at elevated temperatures. Furthermore, due to the lower symmetry of the III-V semiconductors, anti-phase boundaries are often formed.

It is an object of the invention to improve on existing techniques for growing a single crystal material on a substrate of dissimilar material.

According to one aspect, the present invention provides a method of forming a single crystal layer of a material type on a substrate of a different material type, comprising the steps of:
(i) providing a substrate of a first material type;
(ii) depositing at least one discrete region of catalyst material onto the substrate, the discrete region defining a seed area of the substrate;
(iii) growing a single crystal nanowire of a second material type onto the substrate at the discrete region of catalyst material, the nanowire of second material type extending upward from the substrate with lateral dimensions not substantially exceeding the seed area; and
(iv) changing growth conditions so as to epitaxially grow the second material type laterally from said single crystal nanowire in a direction parallel to the substrate surface.

Figure 2B:
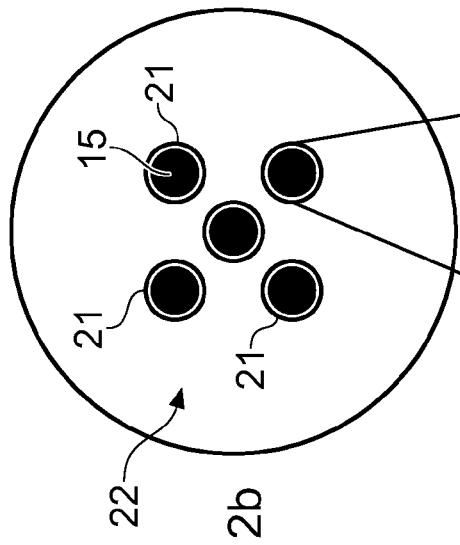
Figure 2A:
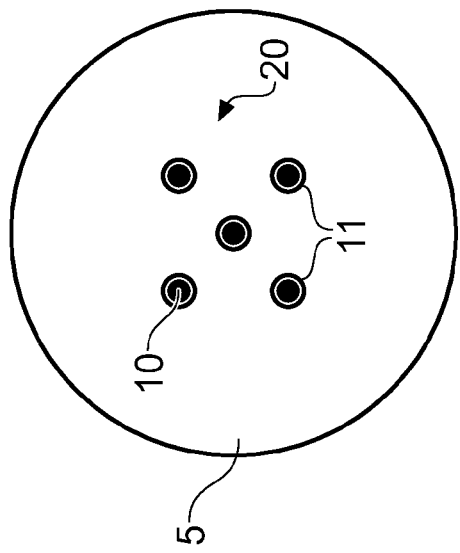

Embodiments of the present invention will now be described by way of example and with reference to the accompanying drawings in which:

FIGS. 1a to 1e are a series of schematic cross-sectional views of a process for forming a layer of single crystal material on a dissimilar material substrate; and FIGS. 2a to 2c are a series of schematic plan views of a substrate on which devices are formed using the processes described herein.

With reference to FIG. 1a, a catalyst material 10 is deposited on one or more selected seed areas 11 of a suitable substrate 5. In preferred processes, the substrate 5 is selected from group IV semiconductor materials such as silicon or germanium although other substrates are possible. Such substrates could include those with $SiO_2$ surfaces, glass substrates, organic materials, foils, etc. The catalyst material 10 may be selected from any material which promotes epitaxial growth of a suitable semiconductor material as discussed later in connection with FIG. 1b. Examples of such catalysts are gold (Au), copper (Cu), aluminium (Al) and indium (In). Where silicon substrates are being used, preferred catalysts may be selected from the list nickel (Ni), cobalt (Co), indium (In) and silicon oxides ($Si_xO_y$), although this list is not exhaustive.

Although only one seed area 11 defined by the catalyst material 10 is shown in FIG. 1, in general an array of seed areas may be defined on the substrate surface in a periodic or non-periodic pattern by way of a plurality of discrete regions of catalyst material on the substrate, as will be described later in connection with FIG. 2a. Each of these discrete regions may be formed by lithographic process defining the discrete regions from a continuous layer of the catalyst material. Alternatively, each of the discrete regions may be formed by self-organisation of nanoparticles. The seed areas 11 preferably have a lateral dimension (i.e. a dimension parallel to the substrate surface) of approximately 100 nm diameter or less, although larger dimensions are possible. More preferably, the seed areas have diameters in the range 5 to 100 nm. Yet more preferably, the seed areas have diameters in the range 5 to 50 nm.

The next step, as shown in FIG. 1b, is to epitaxially grow a single crystal nanowire 12 of suitable material from the substrate 5 using the catalyst material 10. The substrate 5 comprises a first material type (e.g. group IV semiconductor crystal as already mentioned) and the single crystal nanowire 12 comprises a second material type. In preferred arrangements, the second material type is a III-V semiconductor material such as InP, GaP or GaN. II-VI semiconductor materials, group III oxides such as ZnO or III-V alloys are also possible as the second material type.

The growth mechanism for the nanowires 12 may be the VLS (vapour-liquid-solid) mechanism. The nanowire grows at the interface between the catalyst material 10 and the substrate 5 surface. Due to the very small lateral dimensions of the nanowire, as effectively determined by the seed area defined by the catalyst material 10, a single crystal nanowire is possible on many different types of substrate. Any mismatch in lattice parameter can relax on the surface of the nanowire.

Substrate 5 can be any suitable platform from which a single crystal nanowire can be grown. Thus, the expression 'substrate' as used here is intended to encompass any mechanically and physically supporting medium for the nanowire which could include, for example, a top layer of suitable material on top of other layers and/or directly on top of a mechanically supporting substrate. It can be seen that the nanowire effectively can be grown 'freestanding', i.e. not surrounded by, supported by or grown through an aperture in a separate mask layer or other relief structure.

The growth process is controlled in order to obtain an appropriate growth phase, e.g. group III or group IV terminated. With reference to FIG. 1c, after growth of the nanowire to an appropriate depth or height h, a barrier layer 14 is formed (e.g. grown or deposited) on the remaining exposed surface of the substrate 5. For example, in the case of a silicon substrate, the barrier layer 14 may be formed of silicon dioxide. The nanowire may be grown to any suitable height h depending on the application. In general a height h of up to 500 nm will be effective in many applications. However, h may range from a few tenths of a nanometer to several microns or even greater.

With reference to FIG. 1d, following formation of the barrier layer 14, growth of the second material (i.e. the same as that of the nanowire 12) is resumed such that substantially only lateral growth of the second material occurs, to form a layer 15 of the second material. In this lateral growth process, the crystal orientation and growth direction is controlled by the nanowire crystal and not by the substrate crystallography.

The expression 'lateral growth' refers to growth of the single crystal in a direction substantially parallel to the surface of the substrate or orthogonal to the longitudinal axis of the nanowire 12. The lateral growth stage can continue until sufficient area of second material type 15 has been formed for the subsequent fabrication of devices required. The lateral growth stage will extend the lateral dimensions of the second material to at least 200 nm diameter and beyond, depending on the size of active area required for devices to be fabricated.

Where there is an array of nanowires 12 on the substrate 5, the lateral growth may be sufficiently extensive for the layers 15 surrounding each nanowire to converge and coalesce thereby forming a laterally extensive layer 15 of second material type over the substrate of first material type.

After formation of the layer or layers 15, the residual catalyst material 10 together with any small overgrowth of the layer 15 under the catalyst material 10 (i.e. any 'extension' to the nanowire) can be removed by selective etching and/or a suitable planarisation process such as chemical mechanical polishing. This leaves the structure shown in FIG. 1e.

On and/or in this resulting layer 15, e.g. of III-V material, any suitable device or group of devices can be formed. In one example, such a device may be a high electron mobility transistor based on GaN for high frequency applications.

With further reference to FIGS. 1c to 1e, it is noted that the barrier layer 14 (e.g. SiO2 layer) is not essential. Although this may be useful in assisting the prevention of further crystal growth from the substrate 5 rather than from the nanowire 12 during the lateral growth phase of FIG. 1d, the barrier layer 14 can in fact be omitted. In this variant, growth control of the layer 15 to ensure only lateral growth from the nanowire 12 and not from the substrate can be achieved by varying the growth conditions to restrict growth to that from the nanowire crystallography. For instance, this is possible by raising the temperature during an MOVPE (metal-organic vapour phase epitaxy) process. Alternatively, or in addition, pressure changes can be used.

Another possibility for effecting the epitaxial lateral growth from the nanowire is to remove the catalyst material. After removal of the catalyst material, VLS growth is automatically stopped and substantially only lateral growth is possible. Any inhomogeneity in the second material layer thickness can be removed by chemical mechanical polishing, for example.

Depending on the nature of the second material layer 15 required, it can be doped, e.g. during growth or after growth. For example, a semi-insulating layer 15 can be formed by doping III-V material with recombination centres such as Fe in InP during growth or after growth. A conductive layer 15 can be formed by doping with acceptors or donors, preferably (though not exclusively) during growth. The conductive layer can be electrically connected to the substrate via the nanowire contact area 16 with the substrate (FIGS. 1c, 1d). In this case, the nanowire 12 must be doped in the same fashion.

A high degree of control over nanowire growth is possible, and thus the layer 15 can be grown with many different alternative crystalline orientations, according to the nanowire single crystal orientation.

With reference to FIGS. 2a to 2c, a plan view of the structures formed is now described. FIG. 2a shows a plan view of a substrate or portion of a substrate 5 on which the catalyst material 10 has been deposited or grown (as in FIG. 1a) in order to define an array 20 of seed areas 11. Typically these seed areas are each a maximum of 100 nm diameter. FIG. 2b shows an array 22 of active areas 21 formed by the second material layer 15 after the lateral growth process illustrated in FIG. 1d. As shown in FIG. 2c, which is a schematic enlargement of one active area 21 of the array 22, the active area 21 may be used to form one or more devices 25 in the layer 15. Each device may have one or more contact tracks 26 extending therefrom for electrical connection to other devices and/or to the substrate 5.

The process as described above offers a substantial process simplification over some prior art techniques since the critical definition of the second material areas can be controlled using only definition of the seed areas 11 of growth catalyst 10. This definition can be, for example, by optical or e-beam lithography or by imprint techniques. A further advantage is that the nanowire growth and subsequent lateral growth therefrom can be carried out in-situ in the same process chamber. Nanowires can be grown substantially defect free on many substrate materials including amorphous materials. Thus, it is possible using the processes described above to grow a single crystal (or a polycrystalline crystal with an adjustable grain size of larger than 1 micron) of the second material type (e.g. III-V semiconductor) on top of an amorphous substrate.

Other embodiments are intentionally within the scope of the accompanying claims.

The invention claimed is:

1. A method of forming a single crystal layer of a material type on a substrate of a different material type, comprising the steps of:
   (i) providing a substrate of a first material type;
   (ii) depositing at least one discrete region of catalyst material onto a surface of the substrate, the discrete region defining a seed area of the substrate;
   (iii) growing a single crystal nanowire of a second material type onto the substrate at the discrete region of catalyst material, the nanowire of a second material type extending upward from the substrate with lateral dimensions not substantially exceeding the seed area; and
   (iv) changing growth conditions so as to epitaxially grow the second material type towards a lateral direction from said single crystal nanowire, by using the crystalline orientation of the single crystal nanowire to control the growth direction.

2. The method of claim 1 in which the first material type is silicon or germanium, and wherein the second material type extends contiguously from a portion of the single crystal nanowire grown on the substrate at the discrete region of catalyst material through the nanowire and the entire second material type is grown laterally from the nanowire.

3. The method of claim 1 in which the second material type is a III-V or a II-VI semiconductor material or a group III oxide, and in which the lateral direction is at least one of a direction substantially parallel to the surface of the substrate or orthogonal to the longitudinal axis of the single crystal nanowire.

4. The method of claim 1 in which the discrete region of catalyst material extends over the substrate and defines a seed area of 100 nm diameter or less.

5. The method of claim 4 in which the nanowire width or diameter is 100 nm or less.

6. The method of claim 5 in which, after step (iv), the lateral extent of a resulting second material layer is greater than 200 nm.

7. The method of claim 1 further including, after step (iii) and before step (iv), forming a barrier layer over the substrate around the nanowire of the second material type.

8. The method of claim 7 in which the barrier layer is an amorphous electrically insulating layer.

9. The method of claim 1 in which, during step (iii), the nanowire is freestanding.

10. The method of claim 1 further including the step:
(v) removing the catalyst material from the second material type.

11. The method of claim 1 in which step (ii) comprises depositing a plurality of discrete regions of catalyst material onto the substrate in an array.

12. The method of claim 11 in which each discrete region of catalyst material is used, in steps (iii) and (iv), to form an active area in the second material, and further comprising forming at least one electronic device in or on each active area.

13. The method of claim 11 in which each discrete region of catalyst material is formed using a lithographic process or by self-organization of nanoparticles.

14. The method of claim 1 further including the step of doping the second material type with another element or compound.

15. The method of claim 1 in which step (iv) comprises inhibiting upward growth of the nanowire by removing the catalyst material, prior to epitaxially growing the second material type laterally from said single crystal nanowire.

16. The method of claim 1,
wherein growing a single crystal nanowire of a second material type onto the substrate includes growing the single crystal nanowire under first growth conditions and having a crystallography that is different than a crystallography of the substrate surface, and
wherein changing growth conditions so as to epitaxially grow the second material type laterally from said single crystal nanowire in a direction parallel to the substrate surface includes
changing the growth conditions to second growth conditions that are different than the first growth conditions, and using the second growth conditions to terminate growth of the single crystal nanowire from the substrate, and
under the second growth conditions, epitaxially growing the second material type laterally from the single crystal nanowire by controlling crystal orientation and growth direction of the second material type via the crystallography of the single crystal nanowire.

17. A method comprising:
forming a discrete region of catalyst material on a substrate surface of a first material type;
at the discrete region of catalyst material, growing a single crystal nanowire of a second material type extending orthogonally from the substrate surface, the single crystal nanowire having a crystal orientation that is different than a crystal orientation of the substrate surface; and
growing a crystalline structure of the second material type extending laterally from the single crystal nanowire and parallel to the substrate surface by
controlling a lateral growth direction of the crystalline structure using the crystal orientation of the single crystal nanowire to limit the growth of the second material type toward a lateral direction from the single crystal nanowire, and
using growth conditions that mitigate growth of the second material type via the crystal orientation of the substrate surface.

18. The method of claim 17, wherein
growing a single crystal nanowire of a second material type includes growing the single crystal nanowire under first growth conditions including a first temperature and a first pressure, and
using growth conditions that mitigate growth of the second material type via the crystal orientation of the substrate surface includes terminating growth of the second material type via the substrate surface by using at least one of a second temperature different than the first temperature and a second pressure different than the first pressure.

19. The method of claim 17, wherein controlling the lateral growth direction of the crystalline structure using the crystal orientation of the single crystal nanowire includes
terminating growth of the single crystal nanowire and restricting further growth of the second material via crystallography of the substrate surface by removing the catalyst material, and
after terminating the single crystal nanowire growth, laterally growing the crystalline structure of the second material type from the single crystal nanowire.

20. The method of claim 17, wherein
growing the single crystal nanowire includes controlling a crystalline orientation of the single crystal nanowire by controlling a growth condition under which the single crystal nanowire is grown, and
growing a crystalline structure of the second material type includes setting a crystalline orientation of the crystalline structure of the second material type by using the controlled crystalline orientation of the single crystal nanowire.

21. The method of claim 1, further including doping the nanowire and the second material type grown laterally from the nanowire to the same polarity.

* * * * *